United States Patent
Ma et al.

(10) Patent No.: US 11,551,963 B2
(45) Date of Patent: Jan. 10, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Wei Ling Ma, Kaohsiung (TW); Ying-Chung Chen, Kaohsiung (TW); Hsin-Ying Ho, Kaohsiung (TW); Cheng-Ling Huang, Kaohsiung (TW); Chang Chin Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 392 days.

(21) Appl. No.: 16/791,938

(22) Filed: Feb. 14, 2020

(65) Prior Publication Data

US 2021/0257246 A1    Aug. 19, 2021

(51) Int. Cl.
| | |
|---|---|
| *H01L 33/00* | (2010.01) |
| *H01L 33/18* | (2010.01) |
| *H01L 21/82* | (2006.01) |
| *H01L 21/683* | (2006.01) |
| *H01L 31/18* | (2006.01) |

(52) U.S. Cl.
CPC .......... *H01L 21/6836* (2013.01); *H01L 21/82* (2013.01); *H01L 31/186* (2013.01); *H01L 33/0095* (2013.01); *H01L 2221/68327* (2013.01)

(58) Field of Classification Search
CPC ............... H01L 33/0095; H01L 31/186; H01L 21/6836; H01L 31/0203; H01L 33/58; H01L 21/82; H01L 33/486; H01L 2221/68327; H01L 33/56; H01L 33/52
See application file for complete search history.

(56) References Cited

U.S. PATENT DOCUMENTS

| | | | | |
|---|---|---|---|---|
| 6,770,503 | B1 * | 8/2004 | Marinis | B81B 7/0077 |
| | | | | 257/444 |
| 7,223,619 | B2 * | 5/2007 | Wang | H01S 5/423 |
| | | | | 257/E33.072 |
| 7,901,973 | B2 * | 3/2011 | Yamamoto | H01L 27/14618 |
| | | | | 438/110 |
| 8,257,985 | B2 * | 9/2012 | Stevenson | H01L 23/498 |
| | | | | 257/E21.525 |
| 9,094,593 | B2 | 7/2015 | Rudmann et al. | |
| 10,741,613 | B2 * | 8/2020 | Heimgartner | H01L 31/0232 |
| 11,264,541 | B2 * | 3/2022 | Ishida | H01L 33/486 |
| 2016/0181479 | A1 * | 6/2016 | Kim | H01L 33/486 |
| | | | | 257/98 |
| 2019/0103517 | A1 * | 4/2019 | Kim | H01L 33/36 |
| 2019/0245117 | A1 * | 8/2019 | Kim | H01L 33/62 |

* cited by examiner

*Primary Examiner* — Savitri Mulpuri
(74) *Attorney, Agent, or Firm* — Foley & Lardner LLP

(57) ABSTRACT

A semiconductor device package includes a substrate, a partition structure and a polymer film. The partition structure is disposed on the substrate and defines a space for accommodating a semiconductor device. The polymer film is adjacent to a side of the partition structure distal to the substrate. A first side surface of the polymer film substantially aligns with a first side surface of the partition structure.

11 Claims, 12 Drawing Sheets

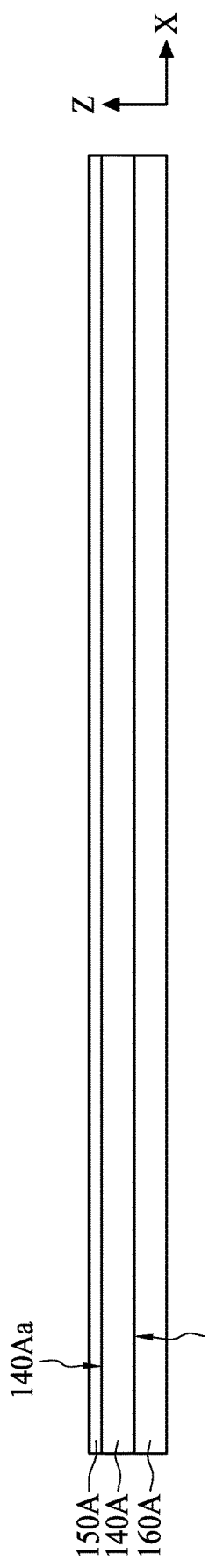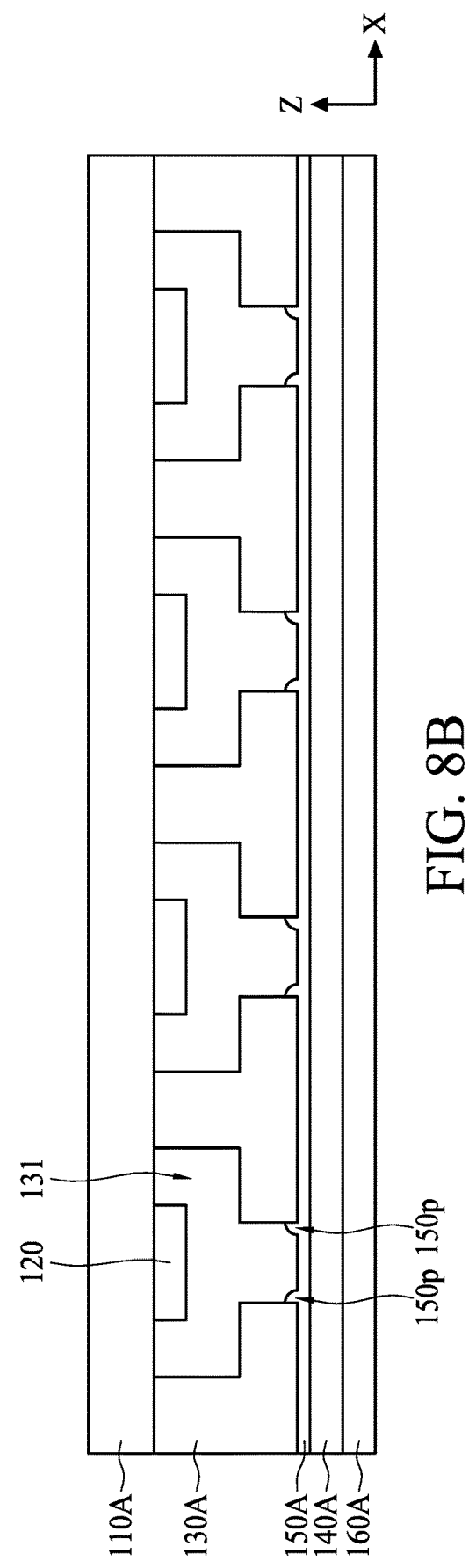

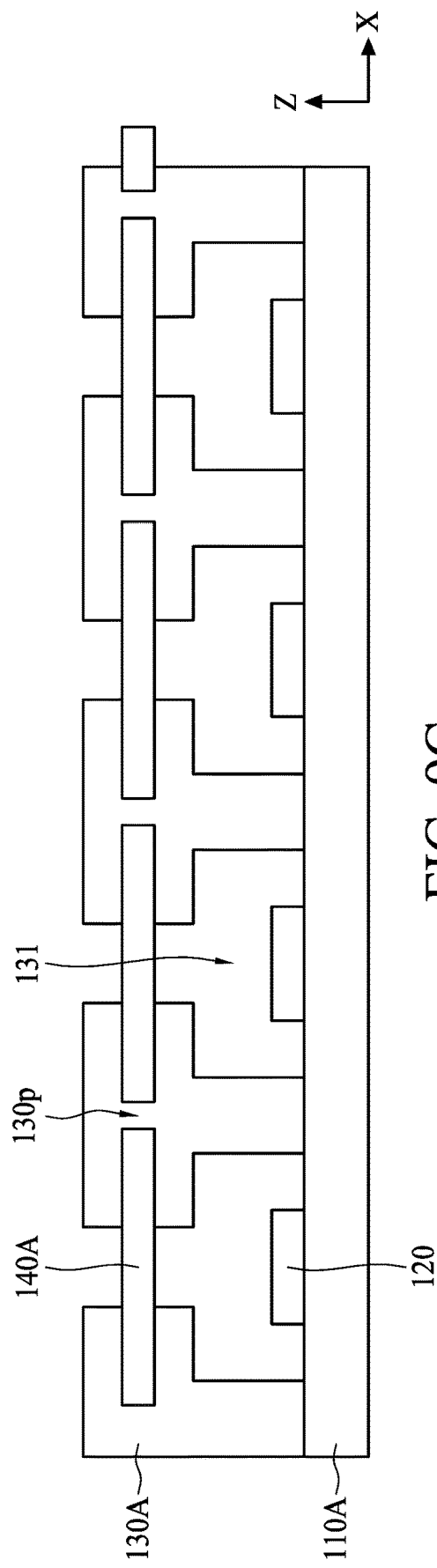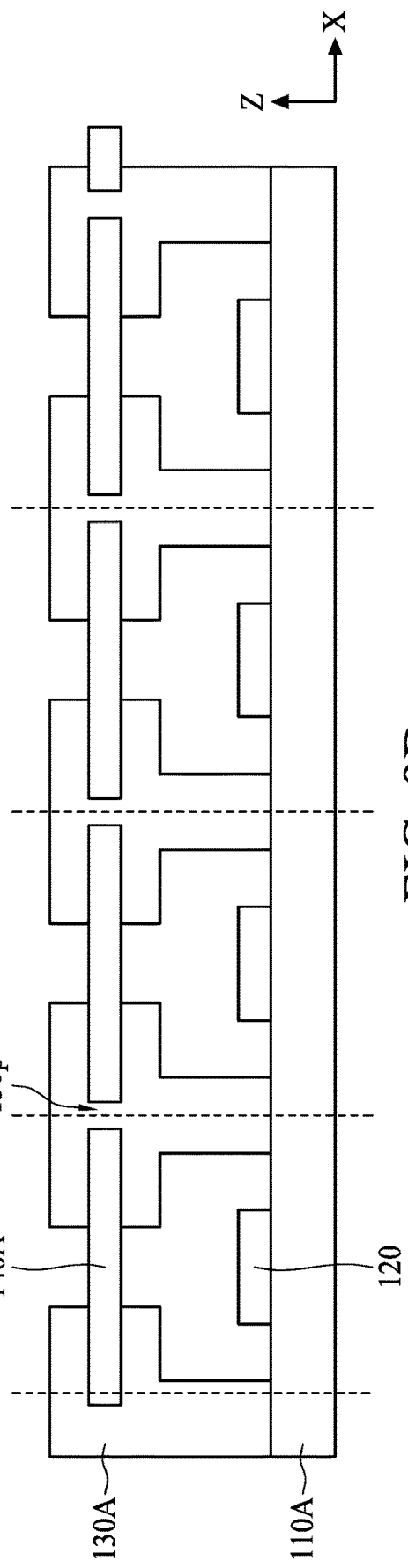

US 11,551,963 B2

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same. More particularly, the present disclosure relates to a semiconductor device package including a polymer film and a method of manufacturing the same.

2. Description of the Related Art

Optical packages are trending toward thinner and smaller product traits in consumer electronics. For example, the total thickness of an optical sensor package becomes a critical specification as far as the request from a system assembly house is concerned. Optical land grid arrays (OLGAs), among other optical packages, is a type of widely used optical sensor package. An OLGA package usually includes a housing for accommodating an optical sensor and a glass cover over the optical sensor. The thickness of the glass cover is usually over 200 μm. With advancements in miniaturization of package structures of devices, thicknesses of the package structures are required to be reduced. Therefore, it has become a challenge to provide solutions to solve the above issues. Other optical packages such as pre-mold quad flat no lead (QFN), open cavity QFN, or the like may face the same thickness reduction hurdle.

SUMMARY

In one or more embodiments, a semiconductor device package includes a substrate, a partition structure and a polymer film. The partition structure is disposed on the substrate and defines a space for accommodating a semiconductor device. The polymer film is adjacent to a side of the partition structure distal to the substrate. A first side surface of the polymer film substantially aligns with a first side surface of the partition structure.

In one or more embodiments, a semiconductor device package includes a substrate, a partition structure and a polymer film. The partition structure is disposed on the substrate and defines a space for accommodating a semiconductor device. The polymer film is disposed over the partition structure. A width of the polymer film is substantially identical to a width of the partition structure.

In one or more embodiments, a method for manufacturing a semiconductor device package includes: providing a substrate; forming a partition structure on the substrate, the partition structure comprising a plurality of spaces, each being configured to accommodate a semiconductor device; and disposing a polymer film on the partition structure and covering the spaces.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 8A, FIG. 8B and FIG. 8C illustrate various operations in a method of manufacturing a semiconductor device package in accordance with some embodiments of the present disclosure;

FIG. 9A, FIG. 9B, FIG. 9C and FIG. 9D illustrate various operations in a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

In some embodiments, the present disclosure provides a semiconductor device package using a polymer film to replace conventional glass cover. The polymer film can achieve a thickness less than 200 μm and maintain a comparable transmittance as conventional glass cover at a peak wavelength of interest, for example, longer than 400 nm. Furthermore, exploiting the polymer film of the present disclosure obviates the glass cutting and/or cleaning operations which normally leads to higher cost and lower yield due to cracking and chipping.

In some embodiments, the polymer film of present disclosure includes a fluoropolymer film. The fluoropolymer film possesses a sufficiently high melting point which is suitable for sustaining reflow operations commonly took place in device packaging.

In some embodiments, the fluoropolymer film is adhered to a partition structure accommodating a semiconductor device with an aid of a bonding layer. The bonding layer is selected so as to be transparent to a peak wavelength emitted by the semiconductor device or configured to be received by the semiconductor device. For example, the bonding layer may be mainly made of silicone.

Figure 1:
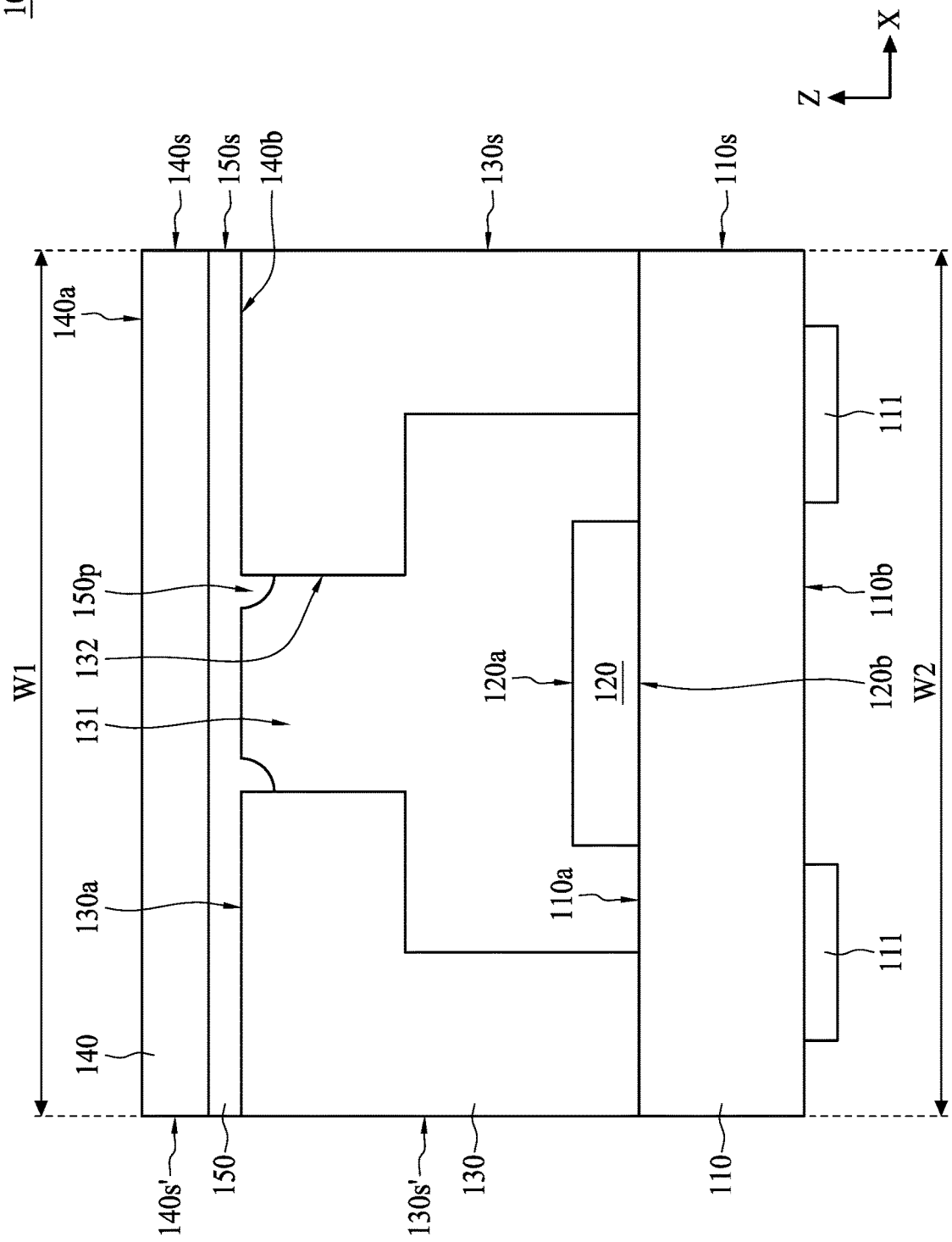
FIG. 1 illustrates a cross-sectional view of a semiconductor device package in accordance with some embodiments of the present disclosure.

FIG. 1 illustrates a cross-sectional view of a semiconductor device package 10 in accordance with some embodiments of the present disclosure. The semiconductor device package 10 includes a substrate 110, a partition structure 130, a polymer film 140 and a bonding layer 150.

The substrate 110 has a surface 110a (also referred to as "a top surface"), a surface 110b (also referred to as "a bottom surface") opposite to the surface 110a, and side surfaces 110s extending between the surface 110a and the surface 110b. The substrate 110 may include one or more conductive pads 111 for electrical connections. In some embodiments, the conductive pad(s) 111 may be in proximity to, adjacent to, or embedded in and exposed at the bottom surface (e.g., the surface 110a) of the substrate 110. The substrate 110 may include an interconnection structure, such as a redistribution layer (RDL) or a grounding element. In some embodiments, the substrate 110 is formed of or includes one or more organic materials (e.g., a molding compound, a bismaleimide triazine (BT) resin, polyimide (PI), polybenzoxazol (PBO), a solder resist, an Ajinimoto build-up film (ABF), polypropylene (PP), an epoxy-based material, FR4, or a combination of two or more thereof) or inorganic materials (e.g., silicon, glass, ceramic, quartz, sapphire, silicon oxide, silicon nitride, or a combination of two or more thereof). In some embodiments, the conductive pad 111 is formed of or includes gold (Au), silver (Ag), copper (Cu), platinum (Pt), palladium (Pd), other metal(s) or alloy(s), or a combination of two or more thereof. In some embodiments, the substrate 110 can be referred to as a carrier of the semiconductor device package 10.

The partition structure 130 is disposed on the substrate 110 and defines a space 131 for accommodating a semiconductor device 120. In some embodiments, the partition structure 130 has a side surface 132 (also referred to as "an inner wall") defining the space 131. In some embodiments, the partition structure 130 has a side surface 130s (also referred to as "an external wall") opposite to the side surface 132.

The semiconductor device 120 may be disposed on the top surface (e.g., the surface 110a) of the substrate 110. The semiconductor device 120 has a surface 120a (also referred to as "a top surface") and a surface 120b (also referred to as "a bottom surface") opposite to the surface 120a. In some embodiments, the bottom surface (e.g., the surface 120b) of the semiconductor device 120 directly contacts the top surface (e.g., the surface 110a) of the substrate 110. In some embodiments, the semiconductor device 120 is spaced apart from the partition structure 130. In some embodiments, the top surface (e.g., the surface 120a) of the semiconductor device 120 is spaced apart from the inner wall (e.g., the side surface 132) of the partition structure 130. In some embodiments, the semiconductor device 120 includes an optical device. The surface 120a can be a light-emitting surface or a light-receiving surface. In some embodiments, the partition structure 130 is opaque to a peak wavelength emitted by the semiconductor device 120 or configured to be received by the semiconductor device 120.

The polymer film 140 is disposed over the partition structure 130. In some embodiments, the polymer film 140 is disposed adjacent to a side of the partition structure 130 distal to the substrate 110. In some embodiments, a width W1 of the polymer film 140 is substantially identical to a width W2 of the partition structure 130. In some embodiments, a side surface 140s of the polymer film 140 substantially aligns with the side surface 130s of the partition structure 130. In some embodiments, the side surface 140s of the polymer film 140 and the side surface 130s of the partitions structure 130 form a continuous cross-sectional surface, s singulation surface. In some embodiments, the polymer film 140 has a side surface 140s' opposite to the side surface 140s, the partition structure 130 has a side surface 130s' opposite to the side surface 130s, and the side surface 140s' of the polymer film 140 substantially aligns with the side surface 130s' of the partition structure 130. In some embodiments, the side surface 140s of the polymer film 140 substantially aligns with the side surface 110s of the substrate 110.

In some embodiments, the polymer film 140 further includes a surface 140a (also referred to as "a top surface") and a surface 140b (also referred to as "a bottom surface") opposite to the surface 140a, and the surfaces 140s and 140s' extend between the surface 140a and the surface 140b. The surface 140b facing toward the semiconductor device 120 directly contacts the bonding layer 150. In some embodiments, the polymer film 140 is composed of fluoropolymer. In some embodiments, the polymer film 140 is composed of ethylene tetrafluoroethylene (ETFE), perfluoroalkoxy alkane (PFA), or a combination thereof. In some embodiments, the polymer film 140 is a fluoropolymer tape. In some embodiments, a thickness of the polymer film 140 is smaller than 150 μm. In some embodiments, a thickness of the polymer film 140 is in a range from about 25 μm to about 100 μm. In some embodiments, a thickness of the polymer film 140 is in a range from about 50 μm to about 75 μm. In some embodiments, the semiconductor device 120 includes an optical device configured to emit or receive light through the polymer film 140.

In the cases where a glass cover is disposed over an optical sensor in a housing of an optical sensor package, it is required to perform cutting and cleaning processes on a large glass substrate to manufacture the glass cover followed by the as-formed glass cover being assembled to the housing. Chipping and/or cracking of the glass substrate may easily occur in the cutting and cleaning processes of the glass substrate, resulting in an undesired reduction of the manufacturing yield. In accordance with some embodiments of the present disclosure, the polymer film 140 is relatively less brittle, and thus the issues of chipping and/or cracking can be effectively prevented, and the yield of the manufacturing process can be improved.

In addition, a glass cover or a glass substrate usually has a thickness of over 200 μm. The thick glass cover not only increases the overall thickness as well as the total weight of the optical sensor package, but may also easily increase the chance of occurrences of chipping and/or cracking of the glass cover and/or glass substrate. In accordance with some embodiments of the present disclosure, by providing the polymer film 140 (e.g., a fluoropolymer film) instead of a glass cover on the partition structure 130 of the semiconductor device package 10, the polymer film 140, particularly a fluoropolymer film, has good chemical resistance, desired optical transparency at a peak wavelength of interest, and sufficiently high melting point to sustain reflow operations. Furthermore, the polymer film 140 is less costly compared to glass materials. Therefore, the overall thickness of the semiconductor device package 10 can be reduced, the optical properties of the semiconductor device package 10 can remain satisfactory, and the manufacturing cost can be reduced as well.

The bonding layer 150 is disposed between the partition structure 130 and the polymer film 140. In some embodiments, the bonding layer 150 directly contacts the partition structure 130 and the polymer film 140. In some embodiments, the polymer film 140 is adhered to the partition structure 130 by the bonding layer 150. In some embodiments, the polymer film 140 is spaced apart from the partition structure 130 by the bonding layer 150. In some embodiments, a side surface 150s of the bonding layer 150 substantially aligns with the side surface 140s of the polymer film 140. In some embodiments, the bonding layer 150 is transparent to a peak wavelength emitted by the semiconductor device 120 or configured to be received by the semiconductor device 120. In some embodiments, the bonding layer 150 is a silicone layer.

In some embodiments, the bonding layer 150 is exposed to the space 131 of the partition structure 130. In some embodiments, the partition structure 130 includes a surface 130a (also referred to as "a top surface") angled with the side surface 132, and the bonding layer 150 directly contacts the surface 130a and the side surface 132 of the partition structure 130. In some embodiments, a portion 150p of the bonding layer 150 extends into the space 131 of the partition structure 130. In some embodiments, the portion 150p of the bonding layer 150 protrudes toward the semiconductor device 120. In some embodiments, the side surface 132 of the partition structure 130 directly contacts the portion 150p of the bonding layer 150. In some embodiments, a thickness of the bonding layer 150 is smaller than 50 μm. In some embodiments, a thickness of the bonding layer 150 is smaller than 30 μm. In some embodiments, a thickness of the bonding layer 150 is in a range from about 10 μm to about 25 μm. In some embodiments, a sum of a thickness of the polymer film 140 and a thickness of the bonding layer 150 is less than 150 μm. In some embodiments, a sum of a thickness of the polymer film 140 and a thickness of the bonding layer 150 is less than 100 μm. In some embodiments, a sum of a thickness of the polymer film 140 and a thickness of the bonding layer 150 is less than 80 μm.

Figure 2:
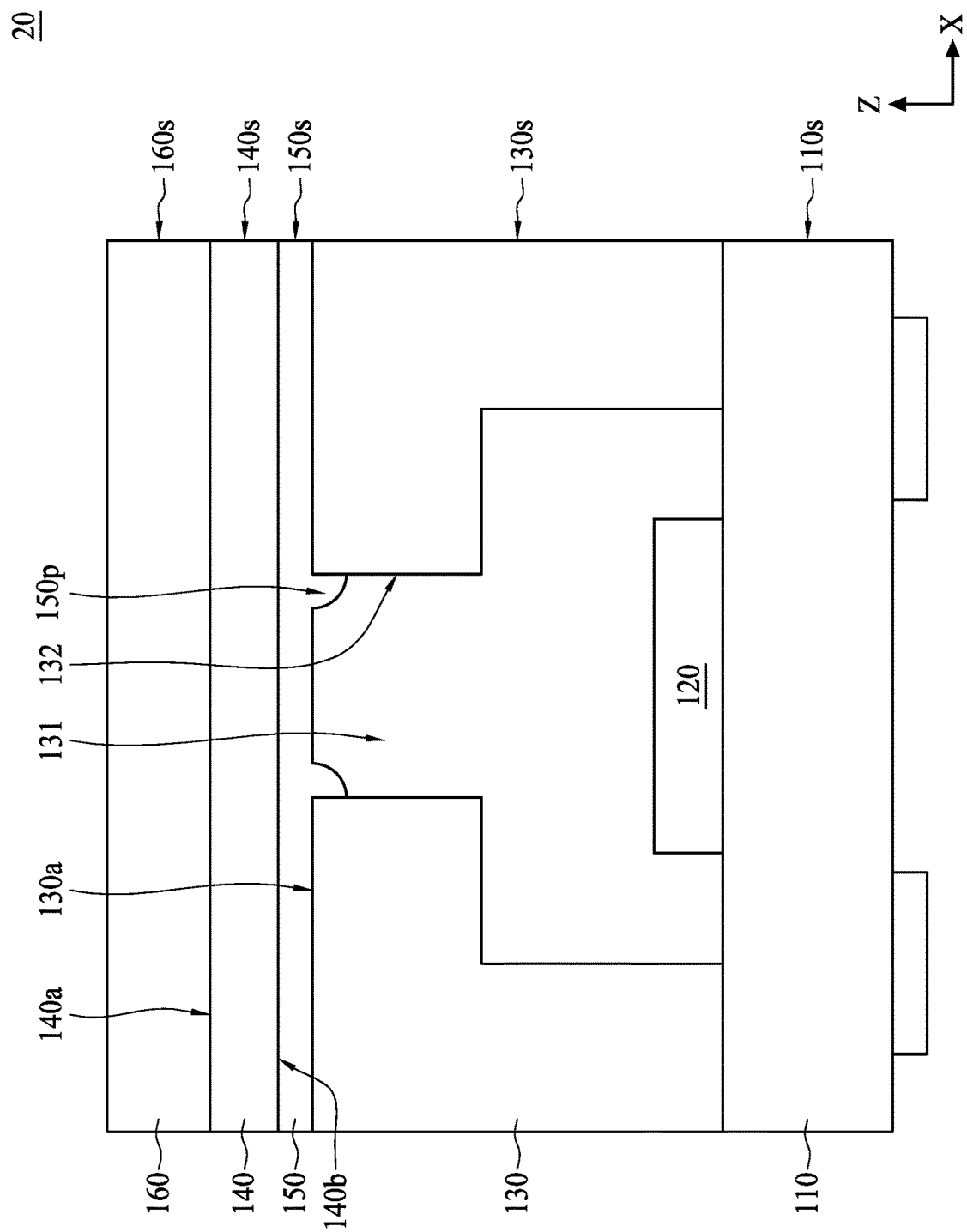
FIG. 2 illustrates a cross-sectional view of a semiconductor device package in accordance with some embodiments of the present disclosure.

FIG. 2 illustrates a cross-sectional view of a semiconductor device package 20 in accordance with some embodiments of the present disclosure. The semiconductor device package 20 is similar to the semiconductor device package 10 in FIG. 1 except that, for example, the semiconductor device package 20 further includes a hardcoat layer 160.

The hardcoat layer 160 is disposed on the polymer film 140. In some embodiments, a side surface 160s of the hardcoat layer 160 substantially aligns with the side surface 140s of the polymer film 140. In some embodiments, the hardcoat layer 160 directly contacts the polymer film 140. In some embodiments, a thickness of the hardcoat layer 160 is equal to or smaller than a thickness of the polymer film 140. In some embodiments, a sum of a thickness of the polymer film 140 and a thickness of the hardcoat layer 160 is less than 150 μm. In some embodiments, a sum of a thickness of the polymer film 140 and a thickness of the hardcoat layer 160 is less than 110 μm.

In some embodiments, the hardcoat layer 160 is transparent to a peak wavelength emitted by the semiconductor device 120 or configured to be received by the semiconductor device 120. In accordance with some embodiments of the present disclosure, the arrangement of the hardcoat layer 160 is advantageous to increase the mechanical strength of the overall semiconductor device package 20 while providing sufficient transparency to a peak wavelength of interest.

Figure 3:
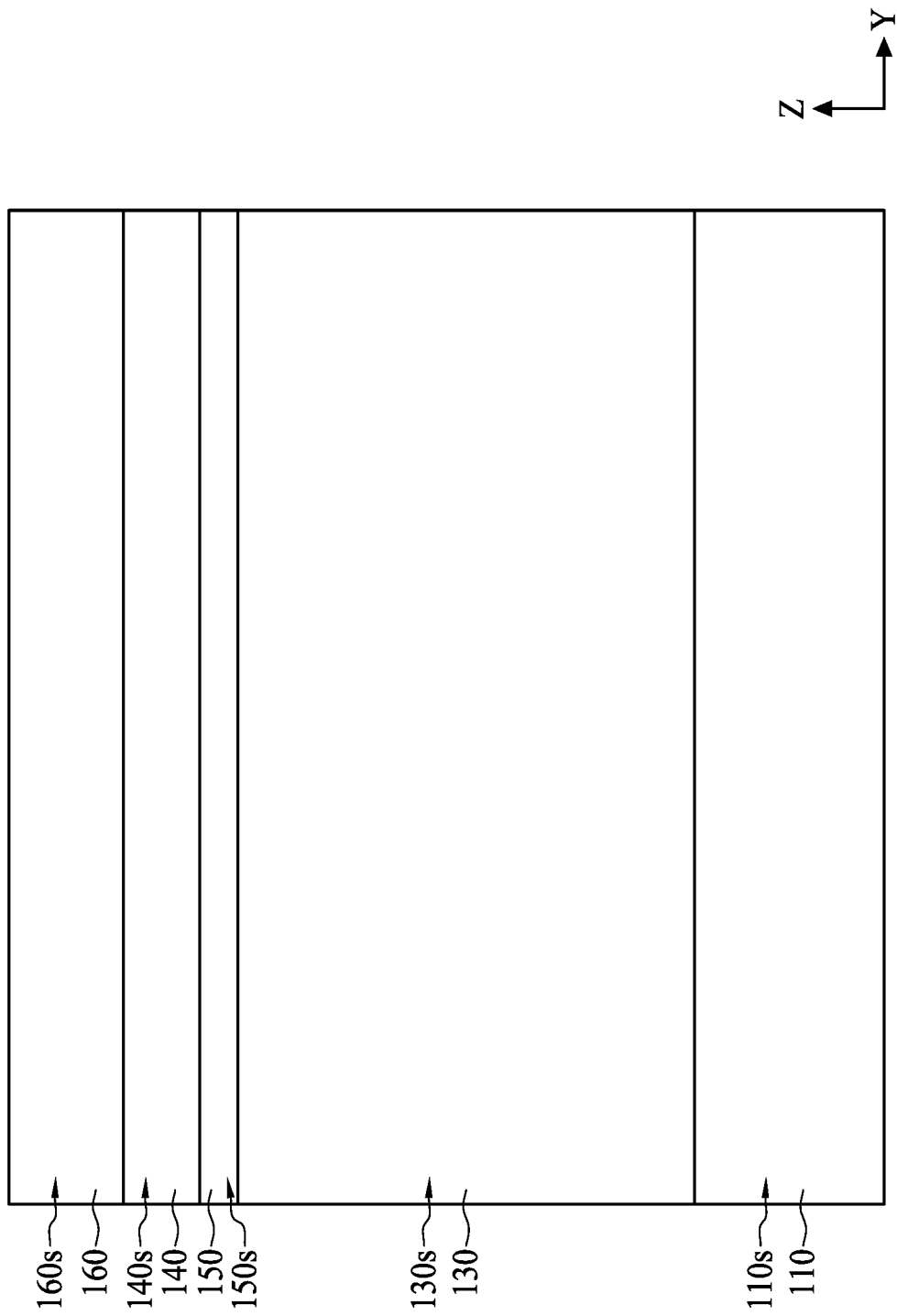
FIG. 3 illustrates a cross-sectional view of a semiconductor device package in accordance with some embodiments of the present disclosure.

FIG. 3 illustrates a cross-sectional view of the semiconductor device package 20 in accordance with some embodiments of the present disclosure. More specifically, FIG. 3 may illustrate a cross-sectional view of the semiconductor device package 20 on the y-z plane as viewed along the x direction. In some embodiments, FIG. 3 may illustrate a side view (e.g., a schematic view of an external sidewall) of the semiconductor device package 20 as viewed along the x direction.

In some embodiments, as shown by the side view in FIG. 3, the side surface 140s of the polymer film 140 is exposed from the side surface 130s of the partition structure 130 and the side surface 150s of the bonding layer 150. In some embodiments, as shown by the side view in FIG. 3, the side surface 140s of the polymer film 140 is exposed from the side surface 160s of the hardcoat layer 160 and the side surface 150s of the bonding layer 150.

Figure 4:
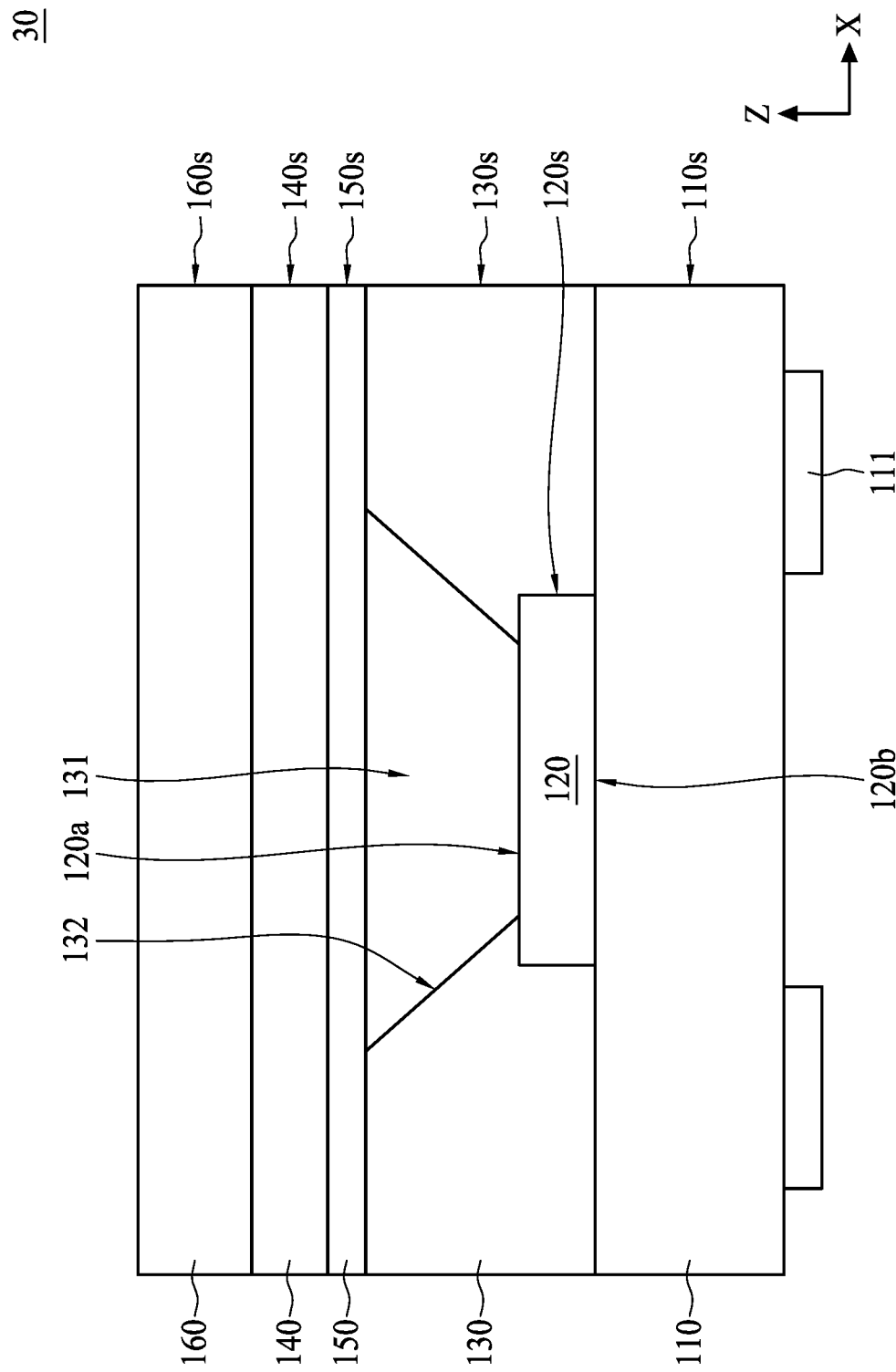
FIG. 4 illustrates a cross-sectional view of a semiconductor device package in accordance with some embodiments of the present disclosure.

FIG. 4 illustrates a cross-sectional view of the semiconductor device package 30 in accordance with some embodiments of the present disclosure. The semiconductor device package 30 is similar to the semiconductor device package 10 in FIG. 1 except that, for example, the partition structure 30 directly contacts the semiconductor device 120.

In some embodiments, the semiconductor device 120 has side surfaces 120s extending between the surface 120a and the surface 120b. In some embodiments, the partition structure 130 covers a portion of the surface 120a of the semiconductor device 120. In some embodiments, the partition structure 130 directly contacts a portion of the surface 120a of the semiconductor device 120. In some embodiments, the partition structure 130 fully covers the side surfaces 120s of the semiconductor device 120. In some embodiments, the partition structure 130 directly contacts the side surfaces 120s of the semiconductor device 120. In some embodiments, the semiconductor device package 30 can be referred to as an open-cavity QFN or an open-cavity quad flat package (QFP). In some embodiments, the partition structure 130 may be composed of polymeric materials, epoxy, epoxy with fillers, molding compound, or the like.

Figure 5:
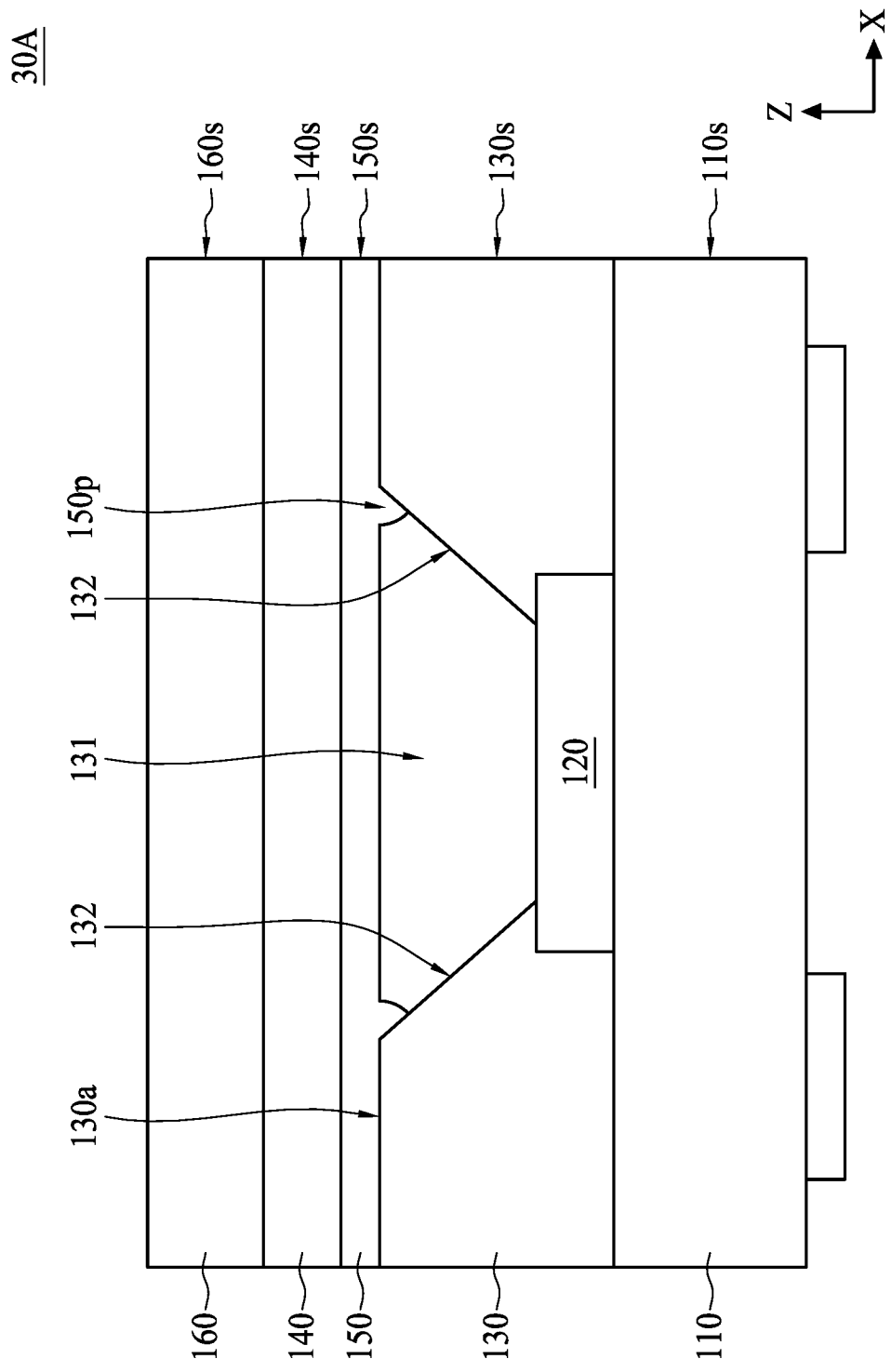
FIG. 5 illustrates a cross-sectional view of a semiconductor device package in accordance with some embodiments of the present disclosure.

FIG. 5 illustrates a cross-sectional view of the semiconductor device package 30A in accordance with some embodiments of the present disclosure. The semiconductor device package 30A is similar to the semiconductor device package 30 in FIG. 4 except that, for example, a portion 150p of the bonding layer 150 extends into the space 131 of the partition structure 130.

In some embodiments, the portion 150p of the bonding layer 150 protrudes toward the semiconductor device 120. In some embodiments, the side surface 132 of the partition structure 130 directly contacts the portion 150p of the bonding layer 150.

Figure 6:
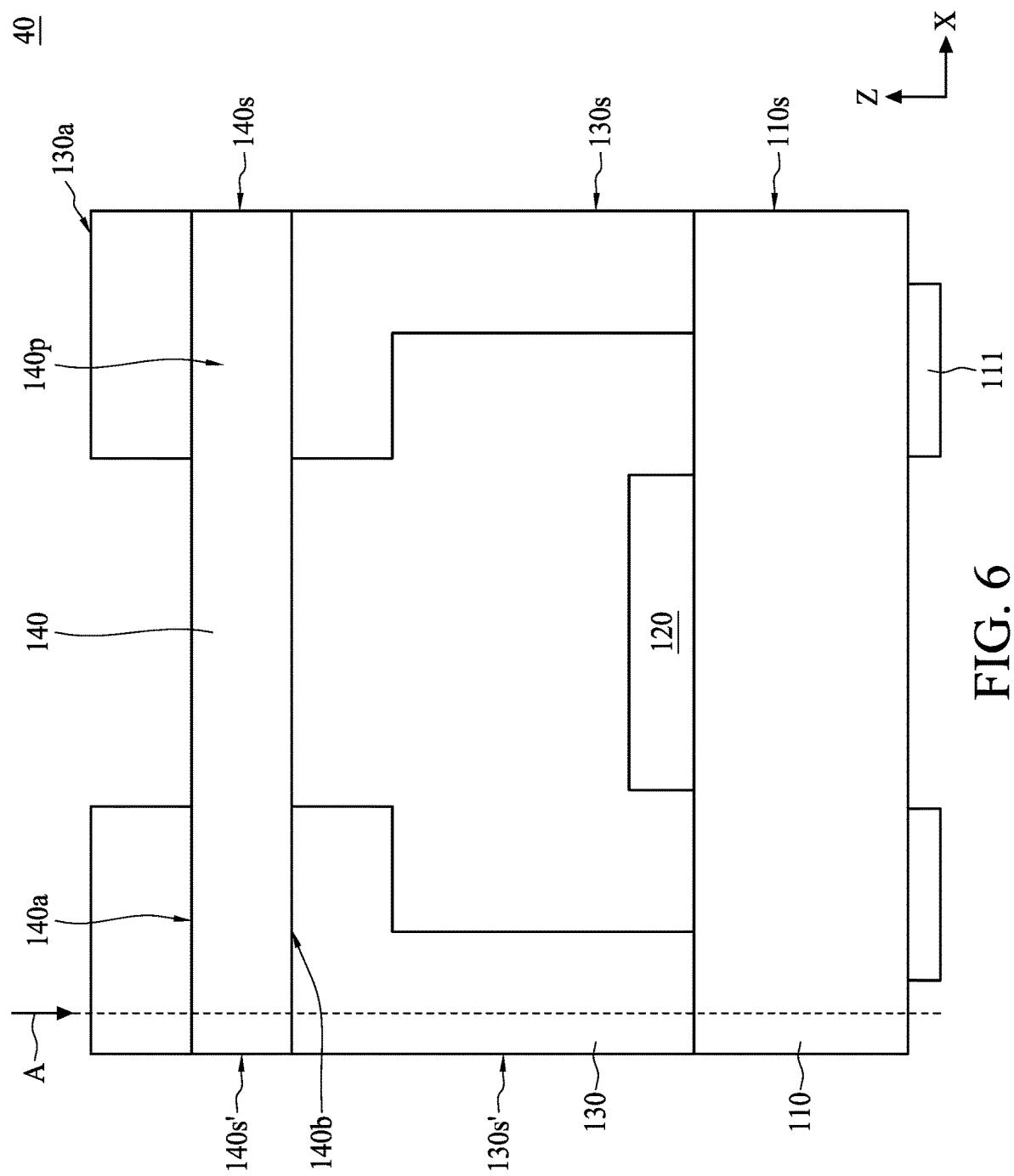
FIG. 6 illustrates a cross-sectional view of a semiconductor device package in accordance with some embodiments of the present disclosure.

FIG. 6 illustrates a cross-sectional view of the semiconductor device package 40 in accordance with some embodiments of the present disclosure. The semiconductor device package 40 is similar to the semiconductor device package 10 in FIG. 1 except that, for example, at least a portion of the polymer film 140 is embedded in the partition structure 130.

In some embodiments, an end portion 140p of the polymer film 140 is embedded in the partition structure 130. In some embodiments, portions of the surfaces 140a and 140b of the polymer film 140 directly contact the partition structure 130. In some embodiments, the surfaces 140a and 140b of the polymer film 140 are located between the semiconductor device 120 and the top surface (e.g., the surface 130a) of the partition structure 130. The side surfaces 140s, 140s' of the polymer film 140 is exposed from, or even aligns with, the side surface of the partition structure 130 embedding the polymer film 140.

Figure 7A:
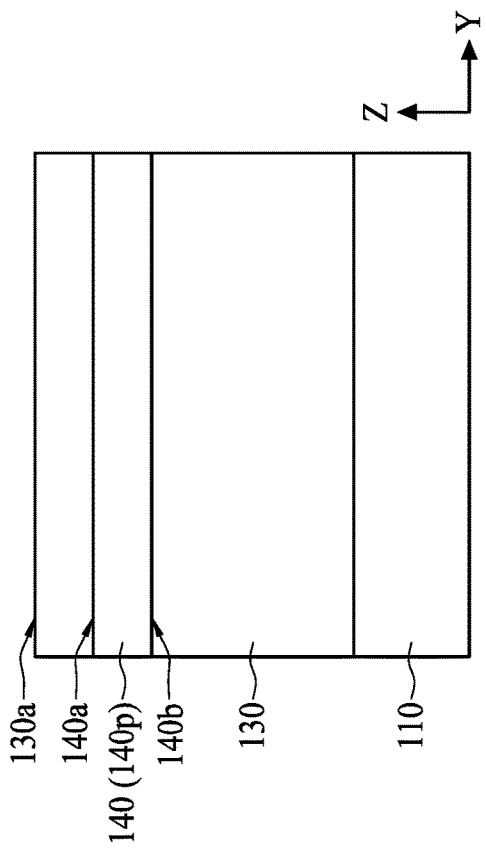
FIG. 7A illustrates a cross-sectional view of a semiconductor device package in accordance with some embodiments of the present disclosure.
Figure 7C:
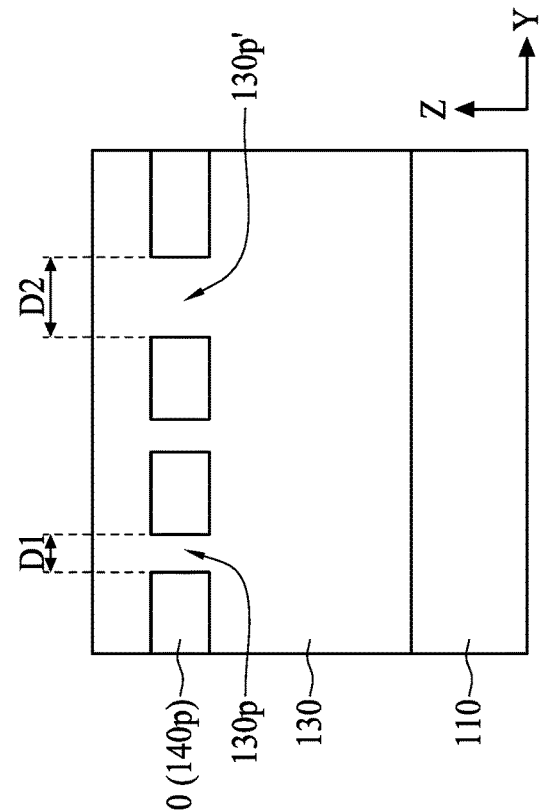
FIG. 7C illustrates a cross-sectional view of a semiconductor device package in accordance with some embodiments of the present disclosure.
Figure 7B:
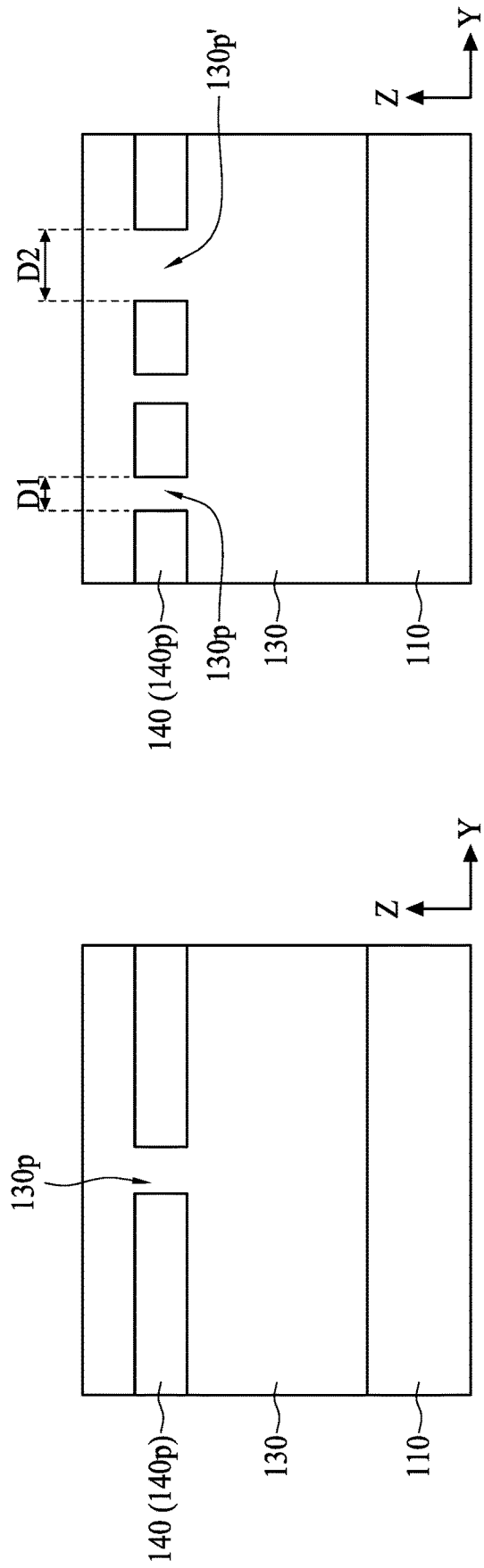
FIG. 7B illustrates a cross-sectional view of a semiconductor device package in accordance with some embodiments of the present disclosure.

FIGS. 7A, 7B and 7C illustrate cross-sectional views of the semiconductor device package 40 in accordance with some embodiments of the present disclosure. More specifically, FIGS. 7A, 7B and 7C illustrate cross-sectional views of the semiconductor device package 40 on the y-z plane as viewed along the x direction. For example, FIGS. 7A, 7B and 7C may illustrate cross-sectional views along the dotted lines A vertically traversing the semiconductor device package 40 in FIG. 6. In some other embodiments, FIGS. 7A, 7B and 7C illustrate side views of the semiconductor device package 40 as viewed along the x direction. Various types of side views of the semiconductor device package 40 depicted in FIGS. 7A, 7B and 7C allows the material of the partition structure 130 to flow and communicate between the space of the mold chase above and below a panel polymer film. Details of the process will be described in FIGS. 9A to 9D of the present disclosure.

As illustrated in FIG. 7A, in some embodiments, the end portion 140p of the polymer film 140 is embedded in the partition structure 130. In some embodiments, the top surface (e.g., the surface 140a) of the polymer film 140 is under the top surface (e.g., the surface 130a) of the partition structure 130. In some embodiments, the surfaces 140a and 140b of the polymer film 140 are located between the top surface (e.g., the surface 130a) of the partition structure 130 and the substrate 110.

As illustrated in FIG. 7B, in some embodiments, the partition structure 130 includes a through portion 130p penetrating through the polymer film 140. In some embodiments, the through portion 130p of the partition structure 130 penetrates through the end portion 140p of the polymer film 140. In some embodiments, the through portion 130p is surrounded by the polymer film 140. In some embodiments, wherein FIG. 7B shows a side view of an external sidewall of the semiconductor device package 40 as viewed along the x direction, a side surface of the through portion 130p of the partition structure 130 substantially aligns with a side surface of the end portion 140p of the polymer film 140.

As illustrated in FIG. 7C in some embodiments, the partition structure 130 includes through portions 130p and 130p', and the through portions 130p and 130p' penetrate through the polymer film 140. In some embodiments, the through portions 130p and 130p' penetrate through the end portion 140p of the polymer film 140. In some embodiments, the through portions 130p and 130p' are surrounded by the polymer film 140. In some embodiments, a size D2 of the through portion 130p' is different from a size D1 of the through portion 130p. In some embodiments, the partition structure 130 may include two or more through portions that are the same or different from each other in size.

Figure 8C:
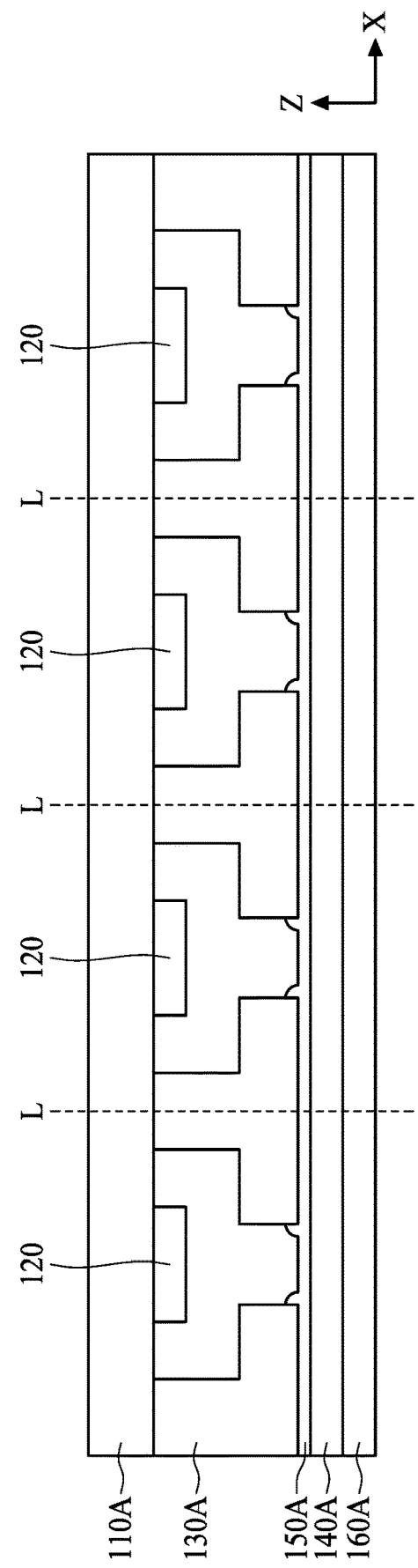

FIGS. 8A, 8B and 8C illustrate various operations in a method of manufacturing a semiconductor device package 10 in accordance with some embodiments of the present disclosure. Various figures have been simplified for a better understanding of the aspects of the present disclosure.

Referring to FIG. 8A, a polymer film 140A is provided. A bonding layer 150A and a hardcoat layer 160A are then formed on the polymer film 140A. In some embodiments, the polymer film 140A has a surface 140Aa and a surface 140Ab opposite to the surface 140Aa, the bonding layer 150A is formed on the surface 140Aa of the polymer film 140A, and the hardcoat layer 160A is formed on the surface 140Ab of the polymer film 140A. In some embodiments, the polymer film 140A, the bonding layer 150A and the hardcoat layer 160A are transparent to a peak wavelength emitted by a semiconductor device 120 or configured to be received by the semiconductor device 120, which will be arranged in the semiconductor device package 10 in subsequent processes. In some embodiments, the polymer film 140A is a fluoropolymer tape. In some embodiments, the bonding layer 150A is an adhesive layer. In some embodiments, the bonding layer 150 is a silicone layer.

Referring to FIG. 8B, a substrate 110A is provided, and a partition structure 130A is formed on the substrate 110A. In some embodiments, the partition structure 130A includes a plurality of spaces 131, and each of the spaces 131 is configured to accommodate one or more semiconductor devices 120. In some embodiments, the partition structure 130A is opaque to a peak wavelength emitted by the semiconductor device 120 or configured to be received by the semiconductor device 120. Then, the polymer film 140A is adhered to the partition structure 130A through the bonding layer 150A. In some embodiments, the polymer film 140A is disposed on the partition structure 130A and covers the spaces 131. In some embodiments, the bonding layer 150A includes an adhesive material that has a relatively low viscosity compared to the partition structure 130 and is thus partially extruded into the space 131 along an inner sidewall of the partition structure 130 upon application of pressure, so that portions 150p of the bonding layer 150A protrude into the spaces 131.

Referring to FIG. 8C, after the polymer film 140A is disposed on the partition structure 130A, a singulation operation is performed to separate the substrate 110A, the partition structure 130A, the polymer film 140A, the bonding layer 150A and the hardcoat layer 160A. In some embodiments, the singulation operation includes cutting through the substrate 110A, the partition structure 130A, the polymer film 140A, the bonding layer 150A and the hardcoat layer 160A along dotted lines L between adjacent semiconductor devices 120. After the singulation operation is performed, the semiconductor device packages 10 as shown in FIG. 1 are formed.

In the cases where glass is used as a cover of an optical sensor package, each of the glass covers for each of the packages has to be formed by cleaning and cutting a large glass substrate prior to performing a singulation operation, and then each glass cover is assembled to a corresponding housing structure to form each of the optical sensor packages. If a large glass substrate is assembled before the singulation operation is performed, the large glass substrate may easily crack upon performing the singulation operation, for example, by cutting, which can adversely affect the manufacturing yield. In contrast, in accordance with some embodiments of the present disclosure, the polymer film 140A is less brittle and has sufficient transparency to a peak wavelength of interest comparable to that of glass, thus the polymer film 140A can be assembled to the partition structure 130A before the singulation operation is performed, such that the polymer film 140A does not crack and/or chip upon performing the singulation operation, the yield of the manufacturing process of the semiconductor device package 10 is improved, and the manufacturing process is simplified.

FIGS. 9A, 9B, 9C and 9D illustrate various operations in a method of manufacturing a semiconductor device package 40 in accordance with some embodiments of the present disclosure. Various figures have been simplified for a better understanding of the aspects of the present disclosure.

Figure 9A:
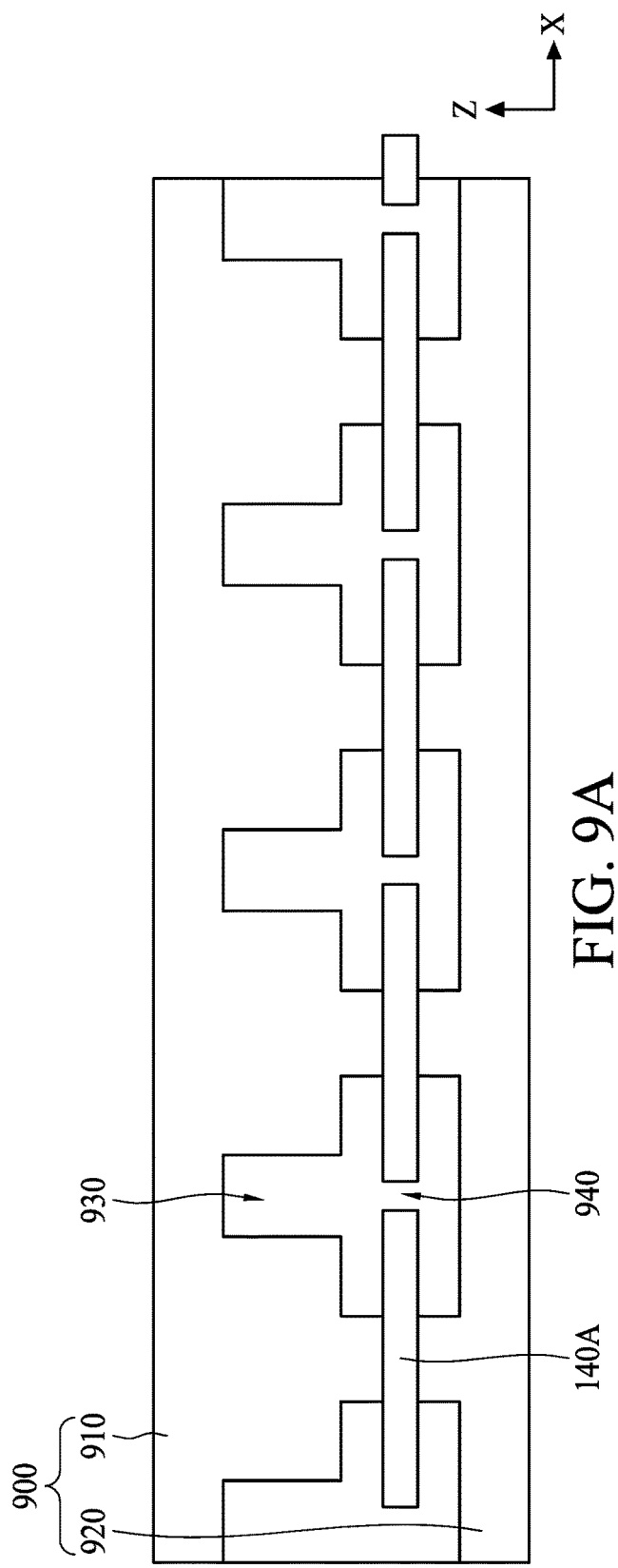

Referring to FIG. 9A, a mold chase 900 including an upper member 910 and a lower member 920 defining a plurality of cavities 930 is provided. In addition, a polymer film 140A with through holes 940 is provided prior to placing the same between the upper member 910 and the lower member 920. In some embodiments, each of the through holes 940 is formed within and surrounded by the polymer film 140A. In some embodiments, the through holes 940 may be formed by, for example, a punching operation where a predetermined area density of holes are formed by punching through the polymer film 140A.

It should be noted that the through holes 940 may only be formed in certain regions of the polymer film 140A, and the cross-sectional view as shown in FIG. 9A is taken along the line on which the through holes 940 are formed. Other cross-sectional views (not shown in FIG. 9A) may be taken along other regions of the polymer film 140A that are free from through holes 940, and a continuous polymer film 140A free from through holes 940 may be shown in these cross-sectional views. For example, the cross-sectional view as shown in FIG. 6 shows the region of the polymer film 140 that is free from through holes 940 and thus free from through portions 130p.

Still referring to FIG. 9A, the polymer film 140A is then placed between the upper member 910 and the lower member 920, and the through holes 940 of the polymer film 140A are located in the cavities 930 of the mold chase 900, as shown in FIG. 9A. In some embodiments, the portion of the polymer film 140 in each of the cavities 930 is arranged with at least one of the through holes 940. Next, a partition structure material is injected into the mold chase 900 and through the communication of the through holes 940, and the partition structure material may fully fill the cavities 930 of the mold chase 900 and encapsulating the polymer film 140A. In some embodiments, the partition structure material includes a curable material, for example, a liquid crystal polymer (LCP).

Figure 9B:
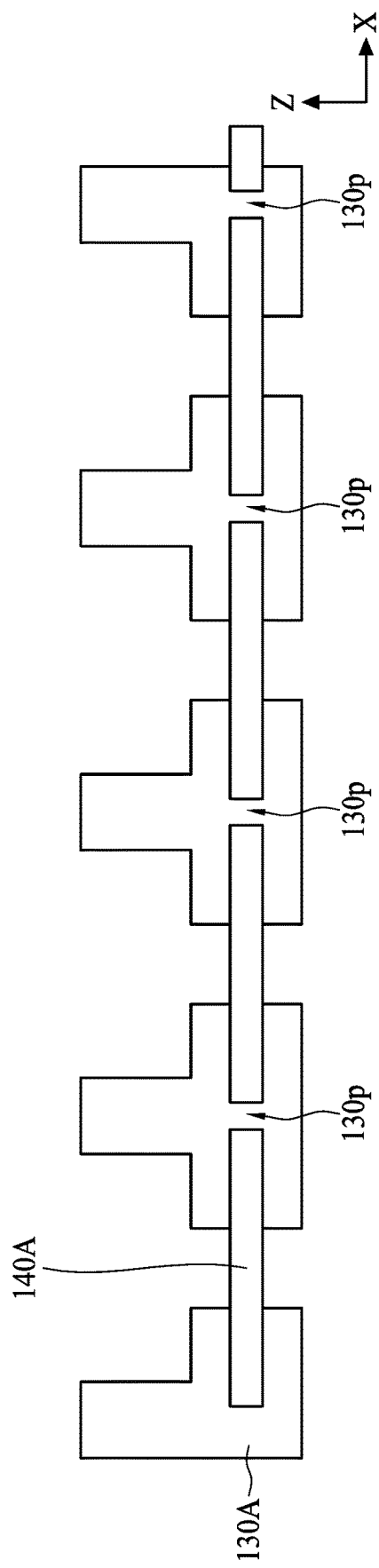

Referring to FIG. 9B, the partition structure material is cured and demolded to form the partition structure 130A. In some embodiments, the through holes 940 are filled with the cured partition structure material so as to form through portions 130p of the partition structure 130A. Next, the upper member 910 and the lower member 920 are removed. As shown in FIGS. 9A and 9B, the partition structure 130 is formed by insert molding in accordance with some embodiments of the present disclosure.

Referring to FIG. 9C, semiconductor devices 120 are disposed on a substrate 110A, and the partition structure 130A with the polymer film 140A embedded therein is disposed on the substrate 110A, and thereby a plurality of spaces 131 are defined by the substrate 110A, the partition structure 130A and the polymer film 140A. In some embodiments, each of the semiconductor devices 120 is correspondingly disposed in each of the spaces 131.

Referring to FIG. 9D, a singulation operation is performed to separate the substrate 110A, the partition structure 130A and the polymer film 140A. As such, the semiconductor device package 40 as shown in FIG. 6 is formed.

In accordance with some embodiments of the present disclosure, the polymer film 140A is placed in the mold chase 900 of the injection molding process for forming the partition structure 130A when the partition structure material is injected into the mold chase 900, followed by the curing process of the partition structure material, such that the polymer film 140A can be stably embedded in the as-formed partition structure 130A without applying any additional adhesive and/or bonding structure between the polymer film 140A and the partition structure 130A. Therefore, in the as-formed semiconductor device package 40, the polymer film 140 can be stably attached to the partition structure 130, and thus the semiconductor device package 40 is provided with sufficient transparency at a peak wavelength of interest as well as improved reliability.

In addition to the operations described in FIGS. 9A to 9D, where the polymer film 140A is disposed in the mold chase 900 in a panel form prior to the injection of the partition structure material, an alternative operation can be performed by cutting the polymer film 140A into suitable size (e.g., a "singulated polymer film") covering an area about a single space 131 of the partition structure 130 and disposing the singulated polymer film in a single package mold chase (not illustrated) in a singulated form. The latter operation is performed under a package-by-package sequence and may be free of the singulation operation used in the former operation, i.e., separating the panel polymer film and the panel partition structure altogether. The latter operation can also be conducted by insert molding technique.

Figure 10:
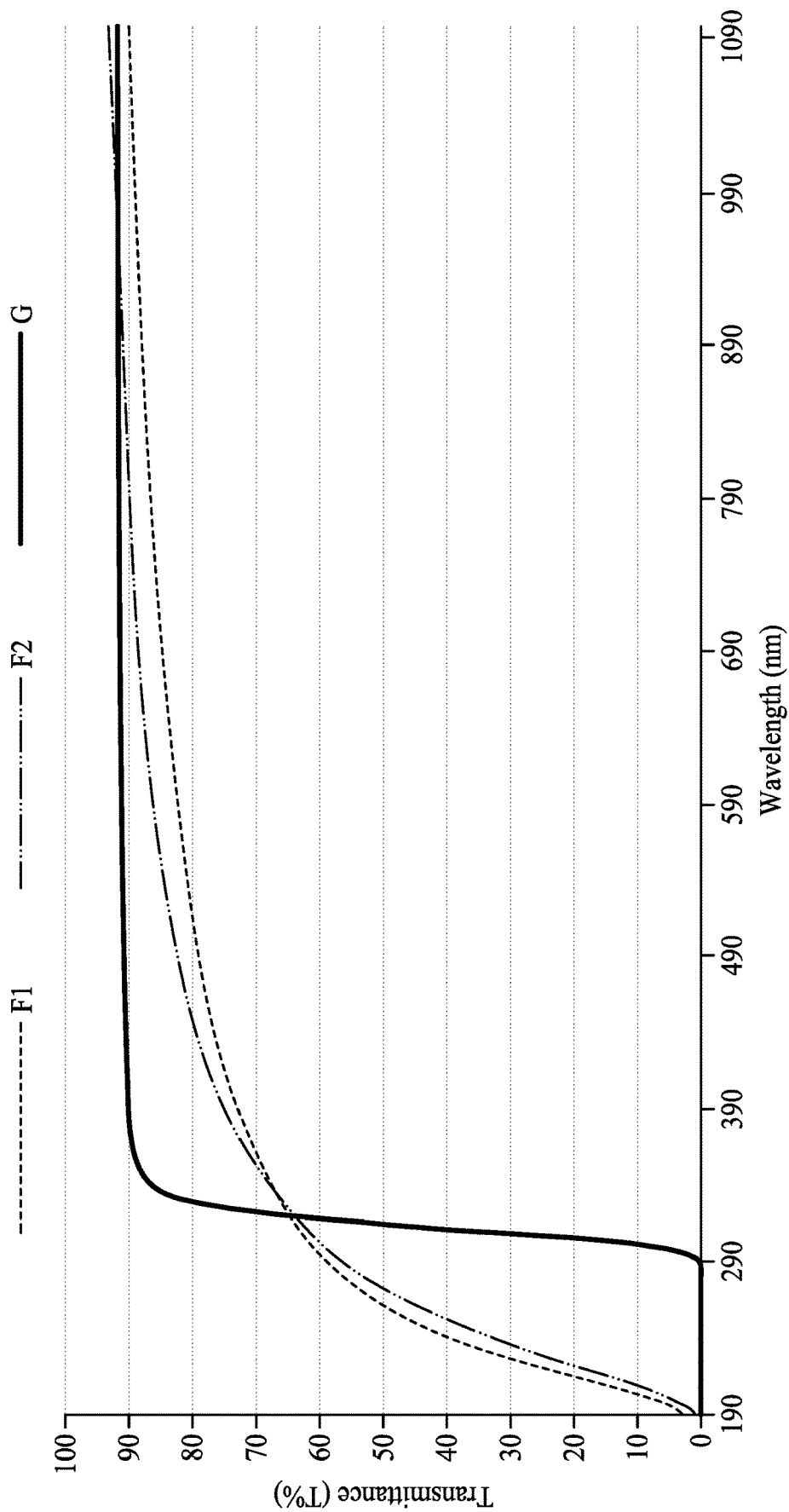
FIG. 10 shows transmittance vs. wavelength spectra of glass and various composite films in accordance with some embodiments of the present disclosure.

FIG. 10 shows transmittance vs. wavelength spectra of glass G and various composite films F1 and F2 in accordance with some embodiments of the present disclosure. In the embodiments as shown in FIG. 10, the glass G has a thickness of about 150 which is thinner than the glass cover conventionally used in an optical package. In the embodiments as shown in FIG. 10, the composite films F1 and F2 are both doubled layered films each made of a fluoropolymer film and a bonding layer, the fluoropolymer is mainly made of perfluoroalkoxy alkane (PFA), and the bonding layer is mainly made of silicone. In the embodiments as shown in FIG. 10, the composite film F1 is not performed with any reflow process thereon, and the composite film F2 is performed with three reflow processes thereon. The reflow processes for the composite film F2 were performed under a temperature of about 260° C. according to the standard practices and procedures of reflow processes defined in JEDEC standard.

As shown in FIG. 10, the composite films F1 and F2 both have sufficient transparency at a peak wavelength of interest, for example, a wavelength of 390 nm or longer than 390 nm. The spectra in FIG. 10 clearly show that the composite films F1 and F2 both have sufficient transparency to a peak wavelength of interest comparable to that of the thin glass G. In some embodiments as shown in FIG. 10, the composite films F1 and F2 both have a transparency level of at least 70% to a peak wavelength of visible light. In addition, elevated temperature treatment such as reflow operations does not deteriorate the transmittance of the fluoropolymer of the polymer film adopted in the present disclosure, as is evidenced in the transmittance of the composite film F1 and the composite film F2. According to the above, the composite film in accordance with some embodiments of the present disclosure has desired optical transparency at a peak wavelength of interest.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a substrate;
    a partition structure disposed on the substrate and defining a space for accommodating a semiconductor device;
    a polymer film adjacent to a side of the partition structure distal to the substrate, wherein a first side surface of the polymer film substantially aligns with a first side surface of the partition structure, wherein the semiconductor device comprises an optical device configured to emit or receive light through polymer film; and
    a bonding layer disposed between the partition structure and the polymer film, wherein a portion of the bonding layer extends into the space of the partition structure.

2. The semiconductor device package of claim 1, wherein the polymer film is composed of fluoropolymer.

3. The semiconductor device package of claim 1, wherein the first side surface of the polymer film substantially aligns with a first side surface of the substrate.

4. The semiconductor device package of claim 1, wherein a first side surface of the bonding layer substantially aligns with the first side surface of the polymer film.

5. The semiconductor device package of claim 1, further comprising a hardcoat layer disposed on the polymer film.

6. A semiconductor device package, comprising:
    a substrate;
    a partition structure disposed on the substrate and defining a space for accommodating a semiconductor device; and
    a polymer film adjacent to a side of the partition structure distal to the substrate, wherein a first side surface of the polymer film substantially aligns with a first side surface of the partition structure;
    wherein an end portion of the polymer film is embedded in the partition structure, and the partition structure comprises a first through portion penetrating through the polymer film, wherein a bonding film is disposed between the partition structure and the polymer film is transparent to a peak wavelength emitted by the semiconductor device or configured to be received by the semiconductor device.

7. The semiconductor device package of claim 6, wherein the partition structure further comprises a second through portion penetrating through the polymer film, and a size of the second through portion is different from a size of the first through portion).

8. A semiconductor device package, comprising:
    a substrate;
    a partition structure disposed on the substrate and defining a space for accommodating a semiconductor device;
    a polymer film disposed over the partition structure; and
    a bonding layer disposed between the partition structure and the polymer film;
    wherein a width of the polymer film is substantially identical to a width of the partition structure, and a portion of the bonding layer extends into the space of the partition structure wherein the bonding layer is transparent to a peak wavelength emitted by the semiconductor device or configured to be received by the semiconductor device.

9. The semiconductor device package of claim 8, wherein the polymer film is composed of fluoropolymer.

10. The semiconductor device package of claim 9, wherein the bonding layer is exposed to the space of the partition structure.

11. The semiconductor device package of claim 8, wherein the partition structure comprises a first surface and a second surface angled with the first surface, and the bonding layer directly contacts the first surface and the second surface of the partition structure.

* * * * *